US005707774A

United States Patent [19]

Deprez et al.

[11] Patent Number: 5,707,774
[45] Date of Patent: Jan. 13, 1998

[54] METHOD FOR PREPARING PHYSICAL DEVELOPMENT NUCLEI FOR USE IN SILVER SALT DIFFUSION TRANSFER PROCESSING

[75] Inventors: Lode Deprez, Wachtebeke; Ronny De Clercq, Aalter; René De Keyzer, Waasmunster, all of Belgium

[73] Assignee: AGFA-Gevaert, N.V., Mortsel, Belgium

[21] Appl. No.: 713,200

[22] Filed: Sep. 12, 1996

Related U.S. Application Data

[60] Provisional application No. 60/007,973 Dec. 5, 1995.

[30] Foreign Application Priority Data

Oct. 20, 1995 [EP] European Pat. Off. ............. 95202842

[51] Int. Cl.$^6$ .................. G03C 8/06; G03C 8/28; G03F 7/07
[52] U.S. Cl. .................. 430/204; 430/231; 430/232; 430/247; 423/266; 423/566.1; 423/561.1
[58] Field of Search .................. 430/204, 232, 430/231, 247; 423/266, 566.1, 561.1

[56] References Cited

U.S. PATENT DOCUMENTS

| | | | |
|---|---|---|---|
| 4,160,670 | 7/1979 | Tsubai et al. | 430/232 |
| 5,153,097 | 10/1992 | Nishinoiri et al. | 430/204 |
| 5,236,802 | 8/1993 | Yamano et al. | 430/232 |
| 5,437,957 | 8/1995 | Yamano et al. | 430/232 |
| 5,445,915 | 8/1995 | Vaes | 430/204 |

FOREIGN PATENT DOCUMENTS

6/130672  5/1994  Japan ................. 430/204

*Primary Examiner*—Richard L. Schilling
*Attorney, Agent, or Firm*—Breiner & Breiner

[57] ABSTRACT

According to the present invention, a method is provided for preparing physical development nuclei for use in silver salt diffusion transfer processing, said physical development nuclei comprising a heavy metal sulphide, said method comprising the steps of:

precipitating said heavy metal sulphide by bringing a water soluble heavy metal compound in reactive association with a water soluble sulphide in an aqueous liquid and said precipitation being carried out in the presence of a hydrophilic polymer so as to disperse said heavy metal sulphide, said hydrophilic polymer comprising a heterocyclic group, characterized in that said heterocyclic group is present in a recurring unit of said hydrophilic polymer, said recurring unit being comprised in said polymer in an amount between 0.1 mol % and 5 mol %.

10 Claims, No Drawings

METHOD FOR PREPARING PHYSICAL DEVELOPMENT NUCLEI FOR USE IN SILVER SALT DIFFUSION TRANSFER PROCESSING

Benefit from provisional application 60/097,873, filed Dec. 5, 1995, is claimed.

DESCRIPTION

1. Field of the Invention

The present invention relates to a method for preparing physical development nuclei comprising a heavy metal sulphide for use in silver salt diffusion transfer processing. In particular the present invention relates to the preparation of physical development nuclei that can be used in preparing an imaging element from which a lithographic printing plate can be prepared according to the silver salt diffusion transfer process.

2. Background of the Invention

The principles of the silver complex diffusion transfer reversal process, hereinafter called DTR process, have been described e.g. in U.S. Pat. No. 2,352,014 and in the book "Photographic Silver Halide Diffusion Processes" by André Rott and Edith Weyde, The Focal Press, London and New York, (1972).

In the DTR process non developed silver halide of an information wise exposed photographic silver halide emulsion layer material is transformed with a so called silver halide solvent into soluble silver complex compounds which are allowed to diffuse into an image receiving element and are reduced therein with a developing agent, generally in the presence of physical development nuclei, to form a silver image having reversed image density values ("DTR image") with respect to the black silver image obtained in the exposed areas of the photographic material.

A DTR image bearing material can be used as a planographic printing plate wherein the DTR silver image areas form the water repellant ink receptive areas on a water receptive ink repellent background. The DTR image can be formed in the image receiving layer of a sheet or web material which is a separate element with respect to the photographic silver halide emulsion material (a so called two sheet DTR element) or in the image receiving layer of a so called single support element, also called mono sheet element, which contains at least one photographic silver halide emulsion layer integral with an image receiving layer in waterpermeable relationship therewith. It is the latter mono sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

Commercial lithographic printing plate precursors of the latter type typically contain on a flexible support, e.g. polyester or paper in the order given a base layer serving as an anti-halation layer, a silver halide emulsion layer and a surface layer containing physical development nuclei in which the silver image is formed.

Alternatively, a lithographic printing plate according to the silver salt diffusion transfer processing may be obtained by providing in the order given on a hydrophilic support such as e.g. an aluminum support (see e.g. EP-A-410500), a receiving layer containing physical development nuclei and a silver halide emulsion. Subsequent to exposure and development the plate is rinsed with water or an aqueous liquid to remove the silver halide emulsion layer and other optional layers on top of the receiving layer so as to expose the silver image formed in the receiving layer.

The above lithographic printing plate precursors, also called imaging elements may be camera exposed or they can be exposed by means of a scan exposure e.g. a laser or L.E.D. exposure. The latter offers the advantage that the preparation of the printing plate is simplified in that a paste-up to be used for the exposure of the imaging element can be completely prepared on a computer. This paste-up prepared on the computer is then transferred to an image setter equipped with e.g. laser that takes care of the exposure of the imaging element.

Lithographic printing plates obtained according to the silver salt diffusion transfer process and in particular those having a flexible support are generally limited in printing endurance as compared to the aluminium based printing plates that use a diazo composition or photopolymer composition as the photosensitive coating for making the printing plate. Nevertheless, lithographic printing plates based on a flexible support offer the advantage that they are less expensive than printing plates based on an aluminum support. DTR-plates having an aluminum support offer an advantage of high sensitivity over a large spectral range.

Accordingly, there is a continuing need for improving the printing endurance of silver salt diffusion transfer plates. A possible improvement in printing endurance should preferably not increase the number of copies that have to be disposed of at start-up of the printing process as a result of e.g. bad ink acceptance or ink acceptance at the non image areas.

EP-A-546598 suggests the use of physical development nuclei having an average diameter less than 6 nm and wherein the relative number of nuclei having a diameter of more than 4.5 nm is less than 15% of the total number of nuclei in the image receiving layer, to reduce the ink acceptance in the non-printing areas.

U.S. Pat. No. 4,160,670 discloses specific hydrophilic copolymers for improving the ink repellant properties of the background areas. Amongst the numerous mentioned copolymers there are mentioned copolymers of acrylamide and a comonomer that has affinity for the physical development nuclei such as e.g. pyridine and imidazole.

DE-A 2.165.358 discloses the use of high molecular weight compounds in the image receiving layer among which are copolymers of acrylamid and N-vinylimidazole.

U.S. Pat. No. 5,236,802 discloses that the presence of polyacrylamide or a copolymer of acrylamide in the physical development nuclei layer or an adjacent layer improves the ink reception of the image areas and further improves the ink repellant properties of the background areas.

U.S. Pat. No. 2,698,237 discloses a DTR-image receiving material comprising an image receiving layer having metal sulfide nuclei precipitated in an aqueous siliciumdioxide dispersion. Said nuclei are teached to show a high activity. Furthermore the presence of hydrophilic organic polymers binders in the layer containing physical development nuclei of a mono-sheet DTR material suitable for preparing a lithographic plate has been disclosed in e.g. U.S. Pat. Nos. 3,728,114; 4,160,670; 4,606,985; 4,510,228; 4,743,525; 4,879,193; 5,153,097; 5,108,871 and 5,041,354.

SUMMARY OF THE INVENTION

It is an object of the present invention to improve the lithographic performance of DTR-based lithographic printing plates in particular such properties as ink-acceptance of the printing areas, ink-repellance of the background (reducing staining and toning) and the printing endurance.

Further objects of the present invention will become clear from the description hereinafter.

It has been found that the objects of the present invention can be met by preparing physical development nuclei comprising heavy metal sulphide and that are comprised in a receiving layer of an imaging element from which a lithographic printing plate can be prepared according to silver salt diffusion transfer processing, the physical development nuclei being prepared according to a method comprising the steps of:

precipitating said heavy metal sulphide by bringing a water soluble heavy metal compound in reactive association with a water soluble sulphide in an aqueous liquid and said precipitation being carried out in the presence of a hydrophilic polymer so as to disperse said heavy metal sulphide, said hydrophilic polymer comprising a heterocyclic group characterized in that said heterocyclic group is present in a recurring unit of said hydrophilic polymer, said recurring unit being comprised in said polymer in an amount between 0.1 mole % and 5 mole %.

The present invention further provides a use of physical development nuclei prepared as set out above in preparing an imaging element from which a lithographic printing plate according to the silver salt diffusion transfer processing can be made.

The present invention further provides a method for making a lithographic printing plate according to the silver salt diffusion transfer process comprising image-wise exposing an imaging element comprising on a support a silver halide emulsion layer and a receiving layer comprising physical development nuclei prepared according to a method as defined above and developing a thus obtained image-wise exposed imaging element in the presence of a silver halide solvent and a developing agent.

DETAILED DESCRIPTION OF THE INVENTION

In accordance with the method of the present invention for preparing physical development nuclei comprising a heavy metal sulphide, a water soluble heavy metal compound and a water soluble sulphide are brought in reactive association in an aqueous liquid. Suitable heavy metals for use in connection with the present invention are for example Pd, Ag, Ni, Co etc., or combinations thereof. Particularly preferred is Pd. A suitable water soluble Pd compound is e.g. $(NH_4)_2PdCl_4$. As water soluble sulphide, sodium and/or potassium sulphide are conveniently used.

According to the present invention the water soluble heavy metal compound and water soluble sulphide are reacted with each other to precipitate a corresponding heavy metal sulphide in the presence of a hydrophilic polymer comprising a heterocyclic group. The hydrophilic polymer thereby acts as a dispersing agent for the heavy metal sulphide.

The heterocyclic group is present in a recurring unit of the hydrophilic polymer and the recurring unit being comprised in the hydrophilic polymer in an amount between 0.1 mol % and 5 mol % and preferably between 0.5 mol % and 1.5 mol %. The optimal amount is dependent on the particular structure of the hydrophilic polymer.

Suitable hydrophilic polymers for use in connection with the present invention are copolymers of a first monomer having a water solubilising group such as e.g. an amide, a carboxylic acid, a hydroxy group, a sulphonic acid group, a phosphonic acid group etc., and a second monomer having a heterocyclic group. In addition to these two monomers, a hydrophilic polymer in accordance with this invention may contain further additional monomers.

Specific examples of heterocyclic groups comprised in the second monomer are e.g. imidazoles, imidazolines, pyrazole, thiazolidine, thiazolidone, thiazolone, indazole, pyridine, triazine, benztriazole, tetrazole, etc.

According to a particularly preferred embodiment in connection with the present invention, the hydrophilic polymer is a copolymer of (meth)acrylamide and one or more vinyl monomer having a heterocyclic group. Such vinyl monomers are e.g. vinyl imidazole, vinyl pyridine, vinyl piperidine, vinyl imidazoline, vinyl quinoline etc. Additional vinyl monomers may be present in such copolymers. Examples of such additional vinyl monomers are vinyl monomers such as vinyl acetate, vinyl butyral, vinyl chloride, vinylidene chloride, vinyl (meth)acrylic acid esters, styrene and derivatives, vinyl ethers, etc. The copolymers may be random copolymers, alternating copolymers or block-copolymers.

The polymerisation degree (number average) of the polymers used in accordance with the present invention is preferably between 20 and 1000. The average polymerisation degree in accordance with the present invention is determined using GPC wherein a solution of 0.05 mol/l of sodium chloride in water is used as the eluent, a TSK column 3000 PW and polyethylene glycol as a standard were used. A too low polymerisation degree will result in dissolution of the polymers from the plate during processing whereas a too large polymerisation degree may present coating difficulties.

The hydrophilic polymer is preferably present or added during the precipitation of the heavy metal sulphide in amount between 0.2% by weight and 2% by weight, more preferably between 0.3% by weight and 1% by weight. Additional hydrophilic polymer may be added subsequent to completion of the precipitation. The total amount of hydrophilic polymer is preferably present from the start of the precipitation although it is also possible to add hydrophilic polymer gradually during precipitation or at discrete intervals during precipitation.

According to a preparation method in connection with the present invention, there can be used a single jet, double jet or multiple jet technique for adding the reactants to each other. According to a single jet method, either the water soluble sulphide is added to the water soluble heavy metal compound or vice versa. In that case, the hydrophilic polymer is preferably present in the solution of the reactant to which the other one is added. Alternatively, the hydrophilic polymer can be added together with one of the reactants to the other. Furthermore, part of the total amount of hydrophilic polymer used during preparation can be present in the solution of the reactant to which the other is added and part can be added with the other reactant.

According to a highly preferred embodiment, the physical development nuclei are prepared by the double jet technique wherein both reactants (water soluble sulphide and water soluble heavy metal compound) are added to a third solution. This third solution preferably contains the hydrophilic polymer. It is also possible to add at least part or even all of the hydrophilic polymer via one or both of the solutions containing the reactants.

According to a third embodiment for the precipitation of the heavy metal sulphide, one may use 3 jets for adding the various ingredients together. Thus, one may add the two reactants and the hydrophilic polymer via separate jets.

In accordance with any of the above double or multi jet techniques, it is also possible to add part of one of the reactants (e.g. the water soluble sulphide) to the solution to which the reactants are added via the jets. Furthermore, the speed of addition of one or more of the reactants may be varied, kept constant or increased during the course of precipitation. In particular, it may be desirable to add part of the hydrophilic polymer at an initial stage and then at one or more discrete intervals during advanced stages (e.g. at the end) of the precipitation.

With respect to obtaining optimal lithographic performance, it is further desirable to prepare heavy metal sulphides with an excessive amount of sulphide relative to its stoichiometric proportion in the heavy metal sulphide that is precipitated. Thus, for example it is preferred in precipitating palladium sulphide, which contains the sulphide ion in a 1:1 stoichiometric amount, to add at least 2 moles of sulphide for one mole of palladium.

During precipitation, there may be present various other ingredients and in particular there may be present other hydrophilic polymers not within the scope of the present invention such as e.g. polyvinyl alcohol and/or poly(meth)acrylic acid.

Alternatively or additionally, hydrophilic polymers that are not in accordance with the present invention may be added after completion of the precipitation. In particular, poly(meth)acrylic acid or poly(meth)acrylamide. It is furthermore possible, to add an additional amount of hydrophilic polymer in accordance with the present invention subsequent to precipitation of the physical development nuclei.

Further, an inorganic colloidal substance can be added during precipitation but preferably after precipitation of the physical development nuclei. Suitable inorganic colloidal substances are e.g. colloidal silica or colloidal clays.

Clays are essentially hydrous aluminum silicates, wherein alkali metals or alkaline-earth metals are present as principal constituents. Also in some clay minerals magnesium or iron or both replace the aluminum wholly or in part. The ultimate chemical constituents of the clay minerals vary not only in amounts, but also in the way in which they are combined or are present in various clay minerals. Natural clays are well known, but it is also possible to prepare synthetic clays in the laboratory, allowing more degrees of freedom that can lead to reproducible tailor made clay products for use in different applications.

From the natural clays smectite clays, including laponites, hectorites and bentonites are well-known and can be used with the present invention. For the smectite clays some substitutions in both octahedral and tetrahedral layers of the crystal lattice may occur, resulting in a small number of interlayer cations. Smectite clays form a group of "swelling" clays which take up water and organic liquids between the composite layers and which have marked cation exchange capacities. From these smectite clays, synthetic chemically pure clays have been produced. They are particularly suitable for use in the present invention.

The clays used in accordance with the invention are preferably smectic clays, more preferably synthetic smectic clays, most preferably synthetic laponites. Preferred synthetic laponite clays for the purposes of this invention are e.g. LAPONITE RD, LAPONITE RDS and LAPONITE JS, trade mark products of LAPORTE INDUSTRIES Limited, London.

Synthetic clays and process for the production thereof have been described in EP-Patent 161 411 B1.

Preferably the physical development nuclei comprising heavy metal sulphide in connection with the present invention are prepared such that they have an average diameter less than 6 nm and the number of nuclei having a diameter larger than 4.5 nm is less than 15% of the total number of nuclei. Although the size of the nuclei above is expressed by a diameter this does not imply that the nuclei are necessarily spherical. By diameter is meant the diameter of a sphere having an equivalent volume so that the size of nuclei of a variety of shapes can be characterized by the same parameter.

According to a highly preferred embodiment in connection with the present invention, the imaging element comprises on a support in the order given a silver halide emulsion layer and a receiving layer comprising physical development nuclei prepared in accordance with the present invention as described above.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single jet method or the double jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride preferably at least 70 mol %, more preferably at least 80 mol % and most preferred at least 95 mol % of silver chloride. The remaining, if any, of the silver halide may be silver bromide and optionally an amount of silver iodide of up to 3 mol %, preferably up to 1.5mol %. According to a particularly preferred embodiment in connection with the present invention, a silver chloroiodide emulsion is used having up to 2 mol % of silver iodide. A silver chloroiodide emulsion may conveniently prepared by first precipitating silver nitrate together with a water soluble chloride, e.g. sodium chloride and then at the end of precipitation, typically during the last 10% thereof, co-precipitating a water soluble iodide e.g. potassium iodide, so that silver halide grains having silver iodide in its shell are obtained.

The average size of the silver halide grains may range from 0.10 to 0.70 µm, preferably from 0.25 to 0.45 µm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in in the silver halide crystal lattice of minor amounts of Iridium and/or Rhodium, so called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur containing compounds during the chemical ripening stage e.g. allyl isothiocyanate, allyl thiourea, and sodium thiosulphate. Also reducing agents e.g. the tin compounds described in BE P 493,464 and 568,687, and polyamines such as diethylene triamine or derivatives of aminomethane sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65 72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The silver halide emulsions may contain the usual stabilizers e.g. homopolar or salt like compounds of mercury with aromatic or heterocyclic rings such as mercaptotriazoles, simple mercury salts, sulphonium mercury double salts and other mercury compounds. Other suitable stabilizers are azaindenes, preferably tetra or penta azaindenes, especially those substituted with hydroxy or amino groups. Compounds of this kind have been described by BIRR in Z. Wiss. Photogr. Photophys. Photochem. 47, 2 27 (1952). Other suitable stabilizers are i.a. heterocyclic mercapto compounds e.g. heterocyclic mercapto compounds substituted with a bulky substituent such as e.g. an alkyl group having at least 5 carbon atoms or aryl group having at least 8 carbon atoms, e.g. a 1-n-heptyl-5-mercaptotetrazole or 3-mercapto-5-n-heptyl-oxadiazole, phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light screening dyes that absorb scattering light and thus promote the image sharpness. Suitable light absorbing dyes are described in i.a. U.S. Pat. No. 4,092,168, U.S. Pat. No. 4,311,787 and DE P 2,453,217.

More details about the composition, preparation and coating of silver halide emulsions can be found in e.g. Product Licensing index, Vol. 92, December 1971, publication 9232, p. 107 109.

Between the support and the silver halide emulsion layer there is preferably provided a base layer that preferably contains an anti-halation substance such as e.g. light absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have a number average diameter of 2–10 µm and more preferably between 2 µm and 5 µm. The matting agents are generally used in a total amount in the imaging element of 0.1 g/m² to 2.5 g/m². At least part of these matting agents and/or light reflection pigments may also be present in the silver halide emulsion layer the most part, preferably at least 80% by weight however preferably being present in said base-layer although all of the matting agent can be included in the silver halide emulsion layer, the base layer then being substantially free of matting agent. In case all matting agent is provided in the silver halide emulsion layer(s), it is preferred to add a non-water swellable latex in the base-layer. Example of a non-water swellable latex are copolymer of styrene and butadiene, polyethylacrylate, polymethylmethacrylate, copolymers of acrylates, copolymers of methacrylates etc. As a further alternative the light reflecting pigments may be present in a separate layer provided between the antihalation layer and the photosensitive silver halide emulsion layer. Like the emulsion layer the base layer is coated preferably at a pH value below the isoelectric point of the gelatin in the base layer.

In a preferred embodiment in connection with the present invention a backing layer is provided at the non light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a multiple layer pack e.g. a double layer pack.

The hydrophilic layers usually contain gelatin as hydrophilic colloid binder. Mixtures of different gelatins with different viscosities can be used to adjust the theological properties of the layer. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast reacting hardeners such as carbamoylpyridinium salts of the type, described in U.S. Pat. No. 4,063,952.

The imaging element used according to the present invention may further comprise various kinds of surface active agents in the photographic emulsion layer or in at least one other hydrophilic colloid layer. Suitable surface active agents include non ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine N oxides; and cationic agents such as alkylamine salts, aliphatic, aromatic, or heterocyclic quaternary ammonium salts, aliphatic or heterocyclic ring containing phosphonium or sulphonium salts. Preferably compounds containing perfluorinated alkyl groups are used. Such surface active agents can be used for various purposes e.g. as coating aids, as compounds preventing electric charges, as compounds improving slidability, as compounds facilitating dispersive emulsification and as compounds preventing or reducing adhesion.

The imaging element of the present invention may further comprise various other additives such as e.g. compounds improving the dimensional stability of the photographic element, UV absorbers, spacing agents and plasticizers.

Suitable additives for improving the dimensional stability of the photographic element are e.g. dispersions of a water soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha Beta unsaturated dicarboxylic acids, hydroxyalkyl (meth) acrylates, sulphoalkyl (meth)acrylates, and styrene sulphonic acids.

Suitable supports of the imaging element in connection with the present invention can be either opaque or transparent, the latter offering the advantage of exposure through the support so that exposure may be carried out in camera's without reversing mirrors. Specific examples of supports are polyethylene coated paper, polypropylene coated paper, opaque or transparent polyester film in particular polyethylene terephthalate. Aluminum supports or other hydrophilic supports may also be used as set out in the introduction. In that case, the receiving layer will be located between the support and the silver halide emulsion layer.

According to a preferred embodiment in connection with the present invention, a polyester film support is used having a thickness between 0.1 mm and 0.35 mm and having a Young-modulus (E-modulus) of at least 4300 N/mm$^2$ and more preferably at least 4500 N/mm$^2$. The Young-modulus also called E-modulus in connection with the present invention can be measured according to method A of the ANSI-D882-91 standard.

A polyester film support is preferably coated with a layer improving the adhesion of the hydrophilic layers.

A particularly suitable adhesion improving layer, comprises a copolymer containing water-soluble monomers and water-insoluble monomers in a molar ratio between 1:99 and 20:80. Preferably the water soluble monomer is a monomer having one or more carboxylic acid groups. An example of an especially preferred copolymer for use in said adhesion improving layer is a polymer containing 1% to 10% by weight, more preferably 1% to 5% by weight of itaconic acid. Suitable polymers containing itaconic acid are e.g. copolymers of itaconic acid and vinylidene chloride, copolymers of itaconic acid, vinylidene chloride and vinylacetate, copolymers of itaconic acid, vinylidene chloride and methyl (meth) acrylate, copolymers of itaconic acid and vinyl chloride, copolymers of itaconic acid, vinyl chloride, vinylidene chloride and methyl(meth)acrylate etc. A copolymer of itaconic acid, vinylidene chloride and optionally methyl(meth)acrylate wherein the amount of itaconic acid is between 1% and 5%, the amount of vinylidene chloride is between 70% and 95% and the amount of methyl(meth) acrylate is between 0% and 15%. The adhesion improving layer is preferably free of gelatin.

On top of this adhesion improving layer there may be provided a further intermediate layer containing microparticles having an average diameter of less than 50 nm preferably colloidal silica and gelatin preferably in a weight ratio of 1:2 and 2:1.

According to a preferred method of the present invention an imaging element comprising on a support in the order given a silver halide emulsion layer and a receiving layer comprising physical development nuclei prepared in accordance with the present invention is image-wise exposed and subsequently developed according to the DTR-process. The DTR mono sheet imaging element in connection with the present invention may be exposed in an apparatus according to its particular application, e.g. a conventional process camera containing a conventional light source or a high intensity short time exposure such as e.g. a laser containing device.

The alkaline processing liquid used for developing the imaging element preferably contains at least part of the silver halide solvent(s). Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones, thiocyanates and thiosulfates. Further suitable silver halide solvents for use in connection with the present invention are described in EP-A 554584. It should be noted that the effects of the present invention are particularly noticed when as silver halide solvents a combination of an alkanol amine and a meso-ionic thiolate compound, preferably a meso-ionic triazolium thiolate, is used.

According to the present invention the alkaline processing liquid preferably also contains hydrophobizing agents for improving the hydrophobicity of the silver image obtained in the image receiving surface layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, U.S. Pat. No. 4,563,410 and EP-A 554584.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone type developing agent and/or p-monomethylaminophenol. Particularly useful auxiliary developing agents are of the phenidone type e.g. 1-phenyl-3-pyrazolidone, 1-phenyl-4-monomethyl-3-pyrazolidone, and 1-phenyl-4,4-dimethyl-3-pyrazolidone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium sequestering compounds, anti sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. No. 3,038,805, U.S. Pat. No. 4,038,075, U.S. Pat. No. 4,292,400, U.S. Pat. No. 4,975,354.

Subsequent to the development in an alkaline processing liquid the surface of the printing plate is preferably neutralized using a neutralization liquid.

A neutralization liquid generally has a pH between 5 and 7. The neutralization liquid preferably contains a buffer e.g. a phosphate buffer, a citrate buffer or mixture thereof. The neutralization solution can further contain bactericids, e.g. phenol, thymol, turpinal or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Further the neutralization solution can contain wetting agents, preferably compounds containing perfluorinated alkyl groups.

The invention will now be illustrated by the following examples without however the intention to limit the invention thereto. All parts are by weight unless otherwise specified.

EXAMPLE

Preparation of the Silver Halide Emulsion Coating Solution

A silver chlorobromide emulsion composed of 98.2 mol % of chloride and 1.8 mol % of bromide was prepared by the double jet precipitation method. The average silver halide grain size was 0.38 μm (diameter of a sphere with equivalent average volume) and contained Rhodium ions as internal dopant. The emulsion was orthochromatically sensitized and stabilized by a 1-phenyl-5-mercapto-tetrazole.

Preparation of the Imaging Elements

Six polyethylene terephthalate film support having a thickness of 175 μm and being provided with a adhesion improving layer were each coated with a layer containing gelatin in an amount of 0.4 g/m$^2$ and colloidal silica having an average particle diameter of 7 nm in an amount of 0.4 g/m$^2$. The adhesion improving layer contained a copolymer of itaconic acid (2%), vinylidene chloride (88%) and methylmethacrylate (10%).

A silver halide emulsion prepared as described above was coated to each of these coated polyethylene terephthalate film supports together with an anti-halation layer (underlying the silver halide emulsion layer) such that the amount of gelatin in the anti-halation layer was 2.7 g/m$^2$ and 1.34 g/m$^2$ for the silver halide emulsion layer. The amount of silver halide expressed as AgNO$_3$ was 1.25 g/m$^2$ and the emulsion layer further contained developing agents and 120 mg/m$^2$ of formaldehyde as a hardener. The anti-halation layer further contained a silica matting agent having an average particle size (weight average diameter) of 3.4 μm and carbon black as anti-halation means. The thus obtained elements were kept at 57° C. at a relative humidity of 34% for 1 day.

Physical development nuclei (PdS) were prepared according to a double jet precipitation wherein a soluble palladium salt (A) and a sodium sulphide solution (B) were added at a constant rate during 4 minutes to a third solution (C) containing sodium sulphide while stirring at 400 rpm. Subsequent to precipitation, the obtained precipitated nuclei were dialysed to a conductivity of 0.5 mS.

The above procedure was applied using different solutions A, B and C to vary the precipitation conditions of the physical development nuclei. The following solutions were prepared:

| | A-solutions: | | | | | |
|---|---|---|---|---|---|---|
| No | (NH$_4$)$_2$PdCl$_4$ (g) | PVA (ml) | PAA (ml) | PAI-1 (ml) | PAI-2 (ml) | water (ml) |
| 1 | 2.17 | 25 | | | | 475 |
| 2 | 2.17 | | 25 | | | 475 |
| 3 | 2.17 | | 375 | | | 125 |
| 4 | 2.17 | | | 375 | | 125 |
| 5 | 2.17 | | | | 375 | 125 |

PVA = 1% solution of polyvinyl alcohol in water
PAA = 1% solution of polyacrylamide in water
PAI-1 = 1% solution of a copolymer of acrylamide (99 mol %) and vinylimidazole (1 mol %)
PAI-2 = 1% solution of a copolymer of acrylamide (98 mol %) and vinylimidazole (2 mol %)

| | B-solutions: | | | | | |
|---|---|---|---|---|---|---|
| No | Na$_2$S (g) | PVA (ml) | PAA (ml) | PAI-1 (ml) | PAI-2 (ml) | water (ml) |
| 1 | 2 | 25 | | | | 475 |
| 2 | 2 | | 25 | | | 475 |
| 3 | 2 | | 375 | | | 125 |
| 4 | 2 | | | 375 | | 125 |
| 5 | 2 | | | | 375 | 125 |

C-solutions:

| No | Na₂S (g) | PVA (ml) | PAA (ml) | PAI-1 (ml) | PAI-2 (ml) | water (ml) |
|---|---|---|---|---|---|---|
| 1 | 3.2 | 40 | | | | 760 |
| 2 | 3.2 | | 40 | | | 760 |
| 3 | 3.2 | | 600 | | | 200 |
| 4 | 3.2 | | | 600 | | 200 |
| 5 | 3.2 | | | | 600 | 200 |

Five precipitations were carried out according to the procedure set out above using solutions Ai, Bi and Ci (wherein i corresponds to a solution number in the above tables). As a result five coating solutions for coating the physical development nuclei were obtained. These solutions were numbered 1 to 5 corresponding to the number of the A-C solutions from which they are obtained. A further coating solution was obtained by adding to coating solution 2 an amount of PAA corresponding to 0.7% (coating solution 2b).

To each of these coating solutions was added formaldehyde and hydroquinone so that the amounts thereof in the final image receiving layer were 30 mg/m² and 0.4 g/m² respectively.

The obtained coating solutions were used to prepare 6 imaging elements by coating the solutions to 6 elements prepared as described above. Subsequently, the imaging elements were kept for 1 day at 57° C. at a relative humidity of 34%.

The following alkaline processing solution was prepared:

| | |
|---|---|
| sodium hydroxide (g) | 30 |
| methylhydroquinone (g) | 2 |
| sodium sulphite anh. (g) | 35 |
| amino-ethylaminoethanol (ml) | 45 |
| compound A (see below) (g) | 0.8 |
| EDTA.4Na (g) | 1 |
| 3-mercapto-5-n.heptyl-oxadiazole (g) | 0.35 |
| water to make | 1 liter |

EDTA.4Na=sodium salt of ethylenediamine tetra-acetic acid

Compound A:

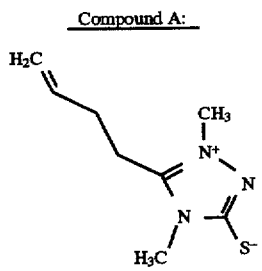

The following neutralization solution was prepared:

| | |
|---|---|
| citric acid | 10 g |
| sodium citrate | 35 g |
| sodium sulphite anh. | 5 g |
| phenol | 50 mg |
| water to make | 1 l |

The following dampening liquid was prepared:

| | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

The above described imaging elements were image-wise exposed and processed at 30° C. with the above described alkaline processing solution, subsequently neutralized at 25° C. with the neutralization solution described above and dried.

The printing plates thus prepared were mounted on an offset printing machine (two color GTO printing machine). During the printing run the described dampening solution was used. The printing properties were evaluated in terms of ink-acceptance of the printing areas and unwanted ink-acceptance of the non-printing areas (toning) during start-up as follows:

ink-acceptance=number of copies needed to obtain a stable density of the printing parts:
1: <10 copies needed
2: 10–15 copies needed
3: >15 copies needed toning=number of copies needed to obtain a clear print with no ink acceptance in the non-printing areas:
1: 100–150 copies
2: 151–250 copies
3: 251–300 copies
4: >300 copies The results obtained are as follows:

| Number of coating solution of the physical development nuclei | Ink-acceptance | toning |
|---|---|---|
| 1 | 2 | 2 |
| 2 | 2 | 4 |
| 2b | 2 | 2 |
| 3 | 2 | 3 |
| 4 | 1 | 1 |
| 5 | 1 | 2 |

We claim:

1. Method for preparing physical development nuclei for use in silver salt diffusion transfer processing, said physical development nuclei comprising a heavy metal sulphide, said method comprising the steps of:
   precipitating said heavy metal sulphide by bringing a water soluble heavy metal compound in reactive association with a water soluble sulphide in an aqueous liquid and
   said precipitation being carried out in the presence of a hydrophilic vinyl polymer so as to disperse said heavy metal sulphide, said hydrophilic vinyl polymer comprising a heterocyclic group, characterized in that said heterocyclic group is present in a recurring unit of said hydrophilic vinyl polymer, said recurring unit being comprised in said polymer in an amount between 0.1 mol % and 5 mol %.

2. A method according to claim 1 wherein said water soluble heavy metal compound is a water soluble palladium compound and said water soluble sulphide is a potassium or sodium sulphide.

3. A method according to claim 1 wherein said hydrophilic vinyl polymer is a copolymer of:

(i) a first vinyl monomer having a solubilizing group selected from the group consisting of an amide, a hydroxy group, a carboxylic acid and a sulphonic acid, (ii) a second vinyl monomer having a heterocyclic group and (iii) optional additional vinyl monomers.

4. A method according to claim 3 wherein said first vinyl monomer is acrylamide or methacrylamide.

5. A method according to claim 3 wherein said second vinyl monomer is vinyl imidazole or vinyl pyridine.

6. A method according to claim 1 wherein said heterocyclic group is present in a recurring unit of said hydrophilic vinyl polymer, said recurring unit being comprised in said polymer in an amount between 0.1 mol % and 1.5 mol %.

7. A method according to claim 1 wherein said hydrophilic vinyl polymer is present in an amount between 0.3% by weight and 1.5% by weight.

8. A method according to claim 1 wherein sulphide is added in amount excessive of the stoichiometric amount of sulphide in said heavy metal sulphide.

9. Method for making an imaging element from which a lithographic printing plate can be prepared according to the silver salt diffusion transfer process, said method comprising the steps of (i) preparing a dispersion of a heavy metal sulphide in a hydrophilic vinyl polymer according to the method of claim 1, (ii) adding said dispersion of a heavy metal sulphide in a hydrophilic vinyl polymer to the coating solution of an image receiving layer and (iii) coating said solution onto an imaging element having a support and a silver halide emulsion layer.

10. Method for making a lithographic printing plate according to the silver salt diffusion transfer process comprising image-wise exposing an imaging element comprising on a support a silver halide emulsion layer and a receiving layer comprising physical development nuclei prepared according to a method as defined in claim 9, and developing a thus obtained image-wise exposed imaging element in the presence of a silver halide solvent and a developing agent.

* * * * *